(12) United States Patent
Potty et al.

(10) Patent No.: US 9,970,987 B2
(45) Date of Patent: May 15, 2018

(54) METHOD AND APPARATUS FOR TEST TIME REDUCTION USING FRACTIONAL DATA PACKING

(71) Applicant: TEXAS INSTRUMENTS INCORPORATED, Dallas, TX (US)

(72) Inventors: Sreenath Narayanan Potty, Trivandrum (IN); Rajesh Mittal, Bangalore (IN); Mudasir Shafat Kawoosa, Srinagar (IN); Vivek Singhal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/239,279

(22) Filed: Aug. 17, 2016

(65) Prior Publication Data

US 2016/0356849 A1  Dec. 8, 2016

Related U.S. Application Data

(63) Continuation of application No. 14/272,760, filed on May 8, 2014, now Pat. No. 9,448,284.

(51) Int. Cl.
*G01R 31/3183* (2006.01)
*G01R 31/3185* (2006.01)
(Continued)

(52) U.S. Cl.
CPC ..... *G01R 31/3177* (2013.01); *G01R 31/3172* (2013.01); *G01R 31/3183* (2013.01);
(Continued)

(58) Field of Classification Search
CPC ...... G01R 31/318335; G01R 31/31727; G01R 31/3183; G01R 31/318533
See application file for complete search history.

(56) References Cited

U.S. PATENT DOCUMENTS 5,111,455 A * 5/1992 Negus ..................... H04J 3/047
  327/407
5,150,364 A * 9/1992 Negus ..................... H04J 3/047
  327/295

(Continued)

OTHER PUBLICATIONS

International Search Report for PCT Application No. PCT/US2015/029996 dated Aug. 27, 2015 (2 pages).

*Primary Examiner* — Joseph D Torres
(74) *Attorney, Agent, or Firm* — John R. Pessetto; Charles A. Brill; Frank D. Cimino

(57) ABSTRACT

An embodiment provides a circuit for testing an integrated circuit. The circuit includes an input converter that receives N scan inputs and generates M pseudo scan inputs, where M and N are integers. A scan compression architecture is coupled to the input converter and generates P pseudo scan outputs in response to the M pseudo scan inputs. An output converter is coupled to the scan compression architecture and generates Q scan outputs in response to the P pseudo scan outputs, wherein P and Q are integers. The input converter receives the N scan inputs at a first frequency and generates the M pseudo scan inputs at a second frequency and the output converter receives the P pseudo scan outputs at the second frequency and generates the Q scan outputs at the first frequency.

5 Claims, 9 Drawing Sheets

(51) Int. Cl.
*G01R 31/317* (2006.01)
*G01R 31/3177* (2006.01)

(52) U.S. Cl.
CPC . *G01R 31/31723* (2013.01); *G01R 31/31727* (2013.01); *G01R 31/318335* (2013.01); *G01R 31/318533* (2013.01); *G01R 31/318544* (2013.01); *G01R 31/318563* (2013.01)

(56) References Cited

U.S. PATENT DOCUMENTS

| | | | | |
|---|---|---|---|---|
| 6,141,782 A * | 10/2000 | Bombal | G01R 31/31813 | 714/728 |
| 7,093,175 B2 * | 8/2006 | Rajski | G01R 31/31813 | 714/728 |
| 7,945,833 B1 * | 5/2011 | Wang | G01B 31/318547 | 714/729 |
| 8,650,524 B1 * | 2/2014 | Chakravadhanula | G06F 17/505 | 716/106 |
| 8,904,256 B1 * | 12/2014 | Chakravadhanula | G01R 31/318547 | 714/729 |
| 2005/0055617 A1 * | 3/2005 | Wang | G01B 31/318335 | 714/727 |
| 2005/0060625 A1 * | 3/2005 | Wang | G01R 31/318547 | 714/727 |
| 2005/0268194 A1 * | 12/2005 | Wang | G01B 31/318547 | 714/733 |
| 2006/0026473 A1 * | 2/2006 | Patrick Tan | G01R 31/318594 | 714/726 |
| 2006/0095818 A1 * | 5/2006 | Bratt | G01B 31/318547 | 714/726 |
| 2008/0222470 A1 | 9/2008 | Satoi et al. | | |
| 2010/0192030 A1 * | 7/2010 | Kapur | G01B 31/318547 | 714/726 |
| 2011/0289369 A1 | 11/2011 | Heon-Hee | | |
| 2012/0226942 A1 * | 9/2012 | Gangasani | G06F 11/27 | 714/30 |
| 2013/0159800 A1 | 6/2013 | Ravi et al. | | |
| 2014/0281777 A1 * | 9/2014 | Bhattacharya | G01R 31/318544 | 714/729 |
| 2014/0289579 A1 * | 9/2014 | Podder | G01R 31/318547 | 714/738 |
| 2014/0304672 A1 * | 10/2014 | Chebiyam | G01R 31/318547 | 716/122 |
| 2014/0317463 A1 * | 10/2014 | Chandra | G01R 31/318536 | 714/729 |
| 2015/0185283 A1 * | 7/2015 | Mittal | G01R 31/318335 | 714/731 |
| 2015/0204945 A1 * | 7/2015 | Sanghani | G01R 31/318552 | 714/727 |

* cited by examiner

| SCAN CLOCK | SCAN CLOCK 1 | SCAN CLOCK 2 | SCAN CLOCK 3 | SCAN CLOCK 4 | SCAN CLOCK 5 | SCAN CLOCK 6 | SCAN CLOCK 7 | SCAN CLOCK 8 | SCAN CLOCK 9 | SCAN CLOCK 10 | SCAN CLOCK 11 | SCAN CLOCK 12 | |
|---|---|---|---|---|---|---|---|---|---|---|---|---|---|
| | | | | | | | | | | | | | ROW 1 |
| INPUT CONVERTER STORAGE | 8 | 7 | 6 | 5 | 4 | 3 | 2 | 1 | 0 | 8 | 7 | 6 | ROW 2 |
| INTERNAL CLOCK | 0 | 1 | 1 | 1 | 1 | 1 | 1 | 1 | 1 | 0 | 1 | 1 | ROW 3 |
| OUTPUT CONVERTER STORAGE | 0 | 1 | 2 | 3 | 4 | 5 | 6 | 7 | 8 | 0 | 1 | 2 | ROW 4 |
| ENABLE SIGNAL | 0 | 1 | 1 | 1 | 1 | 1 | 1 | 1 | 1 | 0 | 1 | 1 | ROW 5 |

FIG. 2

| 302 → SCAN INPUT | 304 → SCAN CLOCK 1 | 306 → SCAN CLOCK 2 | SCAN CLOCK 3 | SCAN CLOCK 4 | SCAN CLOCK 5 | SCAN CLOCK 6 | SCAN CLOCK 7 | SCAN CLOCK 8 | SCAN CLOCK 9 | SCAN CLOCK 10 | 309 → SCAN CLOCK 11 |
|---|---|---|---|---|---|---|---|---|---|---|---|
| S0 | 0 | 1 | 1 | 0 | 1 | 0 | 1 | 0 | 0 | 1 | 0 |
| S1 | 0 | 1 | 0 | 1 | 0 | 0 | 0 | 0 | 0 | 1 | 1 |
| S2 | 1 | 1 | 1 | 1 | 1 | 1 | 0 | 0 | 0 | 0 | 1 |
| S3 | 0 | 1 | 1 | 0 | 1 | 0 | 1 | 1 | 0 | 0 | 1 |
| S4 | 0 | 1 | 0 | 1 | 1 | 1 | 1 | 0 | 0 | 1 | 0 |
| S5 | 1 | 0 | 1 | 0 | 0 | 1 | 0 | 1 | 1 | 1 | 1 |
| S6 | 0 | 1 | 0 | 0 | 0 | 1 | 0 | 1 | 1 | 1 | 0 |
| S7 | 0 | 1 | 1 | 0 | 0 | 1 | 0 | 1 | 1 | 0 | 1 |

308 encompasses Scan Clock 1 through Scan Clock 11.

FIG. 3(a)

| PSEUDO SCAN INPUT | SCAN CLOCK 1 | SCAN CLOCK 2 | SCAN CLOCK 3 | SCAN CLOCK 4 | SCAN CLOCK 5 | SCAN CLOCK 6 | SCAN CLOCK 7 | SCAN CLOCK 8 | SCAN CLOCK 9 | SCAN CLOCK 10 | SCAN CLOCK 11 |
|---|---|---|---|---|---|---|---|---|---|---|---|
| PS0 |  | 0 | 1 | 1 | 0 | 1 | 1 | 0 | 1 |  | 1 |
| PS1 |  | 0 | 1 | 1 | 1 | 1 | 1 | 0 | 0 |  | 1 |
| PS2 |  | 1 | 1 | 0 | 0 | 0 | 1 | 0 | 0 |  | 0 |
| PS3 |  | 0 | 1 | 1 | 0 | 0 | 0 | 0 | 0 |  | 0 |
| PS4 |  | 0 | 1 | 0 | 0 | 0 | 0 | 1 | 0 |  | 1 |
| PS5 |  | 1 | 0 | 1 | 1 | 1 | 1 | 0 | 1 |  | 1 |
| PS6 |  | 0 | 1 | 0 | 0 | 0 | 1 | 0 | 1 |  | 1 |
| PS7 |  | 0 | 0 | 1 | 1 | 1 | 1 | 1 | 1 |  | 0 |
| PS8 |  | 1 | 0 | 1 | 1 | 1 | 1 | 1 | 1 |  | 0 |

FIG. 3(b)

| SCAN INPUT | SCAN CLOCK 1 | SCAN CLOCK 2 | SCAN CLOCK 3 | SCAN CLOCK 4 | SCAN CLOCK 5 | SCAN CLOCK 6 | SCAN CLOCK 7 | SCAN CLOCK 8 | SCAN CLOCK 9 | SCAN CLOCK 10 | SCAN CLOCK 11 | SCAN CLOCK 12 | SCAN CLOCK 13 | SCAN CLOCK 14 | SCAN CLOCK 15 | SCAN CLOCK 16 | SCAN CLOCK 17 | SCAN CLOCK 18 |
|---|---|---|---|---|---|---|---|---|---|---|---|---|---|---|---|---|---|---|
| S0 | 1 | 0 | 1 | 1 | 0 | 1 | 1 | 0 | 1 | 0 | 1 | 1 | 1 | 0 | 1 | 1 | 0 | 1 |
| S1 | 0 | 0 | 1 | 1 | 1 | 1 | 1 | 0 | 0 | 1 | 1 | 1 | 1 | 1 | 1 | 1 | 0 | 0 |
| S2 | 1 | 1 | 1 | 0 | 0 | 0 | 1 | 0 | 0 | 1 | 0 | 0 | 0 | 0 | 0 | 1 | 0 | 0 |
| S3 | 1 | 0 | 1 | 1 | 0 | 0 | 0 | 0 | 0 | 1 | 1 | 1 | 0 | 0 | 0 | 0 | 0 | 0 |
| S4 | 1 | 0 | 0 | 0 | 0 | 0 | 0 | 0 | 0 | 1 | 1 | 0 | 1 | 1 | 0 | 0 | 0 | 0 |
| S5 | 1 | 1 | 1 | 0 | 1 | 0 | 1 | 1 | 1 | 1 | 1 | 1 | 0 | 0 | 1 | 1 | 1 | 0 |
| S6 | 1 | 0 | 1 | 0 | 0 | 1 | 0 | 0 | 1 | 1 | 0 | 1 | 1 | 1 | 0 | 1 | 0 | 1 |
| S7 | 1 | 0 | 1 | 1 | 1 | 0 | 1 | 0 | 1 | 1 | 0 | 1 | 1 | 1 | 0 | 1 | 0 | 1 |

FIG. 6(a)

| SCAN OUTPUT | SCAN CLOCK 1 | SCAN CLOCK 2 | SCAN CLOCK 3 | SCAN CLOCK 4 | SCAN CLOCK 5 | SCAN CLOCK 6 | SCAN CLOCK 7 | SCAN CLOCK 8 | SCAN CLOCK 9 | SCAN CLOCK 10 | SCAN CLOCK 11 | SCAN CLOCK 12 | SCAN CLOCK 13 | SCAN CLOCK 14 | SCAN CLOCK 15 | SCAN CLOCK 16 | SCAN CLOCK 17 | SCAN CLOCK 18 |
|---|---|---|---|---|---|---|---|---|---|---|---|---|---|---|---|---|---|---|
| PS0 |  | 0 | 1 | 1 | 0 | 1 | 1 | 0 | 1 |  | 1 | 1 | 1 | 0 | 1 | 1 | 0 | 1 |
| PS1 |  | 0 | 1 | 1 | 1 | 0 | 1 | 0 | 0 |  | 1 | 1 | 1 | 1 | 1 | 1 | 0 | 0 |
| PS2 |  | 1 | 1 | 0 | 1 | 0 | 0 | 1 | 0 |  | 0 | 0 | 0 | 0 | 0 | 1 | 0 | 0 |
| PS3 |  | 0 | 1 | 1 | 0 | 0 | 0 | 0 | 0 |  | 0 | 1 | 1 | 0 | 0 | 1 | 0 | 0 |
| PS4 |  | 0 | 1 | 0 | 1 | 0 | 0 | 0 | 1 |  | 1 | 0 | 1 | 1 | 0 | 0 | 0 | 0 |
| PS5 |  | 1 | 0 | 1 | 0 | 1 | 0 | 1 | 0 |  | 1 | 1 | 0 | 0 | 1 | 1 | 1 | 0 |
| PS6 |  | 0 | 1 | 0 | 1 | 0 | 1 | 1 | 0 |  | 0 | 1 | 1 | 1 | 0 | 0 | 0 | 1 |
| PS7 |  | 0 | 0 | 1 | 1 | 1 | 0 | 1 | 0 |  | 0 | 0 | 1 | 1 | 1 | 1 | 0 | 1 |
| PS8 |  | 1 | 0 | 1 | 1 | 1 | 1 | 1 | 1 |  |  |  |  |  |  |  |  |  |

METHOD AND APPARATUS FOR TEST TIME REDUCTION USING FRACTIONAL DATA PACKING

CROSS REFERENCES TO RELATED APPLICATIONS

This application is a continuation of U.S. patent application Ser. No. 14/272,760 filed on May 8, 2014 which is hereby incorporated by reference in its entirety.

TECHNICAL FIELD

Embodiments of the disclosure relate generally to scan testing of semiconductor devices such as integrated circuits (ICs).

BACKGROUND

Scan based techniques offer an efficient alternative to achieve high fault coverage compared to the functional pattern based testing. As the design size increases and multi-core SoCs (system-on-chip) becomes essential to drive high speed applications, test data volume and test application time grow unwieldy even in the highly efficient and balanced scan based designs. Scan compression technique is so far, the best technique for test data volume as well as test time reduction during pattern execution of scan inserted designs. Scan compression architecture includes a decompressor for decompression of a data on an input side and a compressor for compression of the data on an output side. The decompressor takes scan inputs and expands them spatially into large number of scan chains internally. Each scan chain has a plurality of scan cells. The more the number of scan inputs to the decompressor, the better will be the expansion and larger will be the number of scan chains. Similarly on the output side of the scan compression architecture, the scan chains are compressed to a small number of scan outputs, also leading to the phenomenon of aliasing. Practically, if more number of scan outputs is available, the lesser will be aliasing and more robust will be the scan compression architecture. However, in case of a very low cost tester (VLCT), a maximum of 8 scan inputs and 8 scan outputs are supported. The maximum number of scan chains required to comprehend observation of scan chains on scan outputs, according to one known scan technique, would be 1024 ($N*2^{(M-1)}$, where N is number of scan inputs and M is number of scan outputs. Each scan chain has 128 scan cells and thus the total number of scan cells is 131072 (128*1024). If the number of scan input and scan output is 9, the number of scan chains would be 2304 and the number of scan cells in each scan chain would be approximately 57 (128×1024/256*9). Thus, when the number of scan inputs and scan outputs are increased from 8 to 9, the number of scan cells in each scan chain reduced by approximately 50%, thus reducing the time required for testing by a huge margin. However, VLCT does not support 9 scan inputs and 9 scan outputs.

In pin-limited devices, such as devices with 5 pins, the number of scan chains required would be 80 ($5*2^{(5-1)}$). Thus, the number of scan cells required in each scan chain would be around 1638 (128*1024/80). As a result, the test timing would increase drastically. Also, to make VLCT compatible with pin-limited devices, a serializer approach is used. In this approach, at least two shift registers are used per scan input. Therefore to support the VLCT for the 5 pin device, a total of 10 shift registers are used at the input side. Further, as the data is shifted through two shift registers, a frequency of data shifting in scan cells is reduced by half, thus increasing the test timing. Also, since only 8 inputs are required, two of these scan inputs from the shift registers would be considered as don't care inputs. The shift registers is an additional overhead on the scan system. In a situation where optimal test timing is achieved at for example 9 pins, the serializer approach does not allow to support 9 pins for a 5 pin device. Thus, when A pins provide optimal test timing and the device is of B pins, the serializer approach does not support A/B, when A is not an integer multiple of B.

SUMMARY

This Summary is provided to comply with 37 C.F.R. § 1.73, requiring a summary of the invention briefly indicating the nature and substance of the invention. It is submitted with the understanding that it will not be used to interpret or limit the scope or meaning of the claims.

An embodiment provides a circuit for testing an integrated circuit. The circuit includes an input converter that receives N scan inputs and generates M pseudo scan inputs, where M and N are integers. A scan compression architecture is coupled to the input converter and generates P pseudo scan outputs in response to the M pseudo scan inputs. An output converter is coupled to the scan compression architecture and generates Q scan outputs in response to the P pseudo scan outputs, wherein P and Q are integers. The input converter receives the N scan inputs at a first frequency and generates the M pseudo scan inputs at a second frequency and the output converter receives the P pseudo scan outputs at the second frequency and generates the Q scan outputs at the first frequency.

Another embodiment provides a method of testing an integrated circuit. In this method, N scan inputs are received at a first frequency and M pseudo scan inputs are generated at a second frequency from N scan inputs. P pseudo scan outputs are generated at the second frequency from M pseudo scan inputs and Q scan outputs are generated at the first frequency from M pseudo scan outputs. A ratio of the first frequency and the second frequency is equal to a ratio of M and N and to a ratio of P and Q, where N, M, P and Q are integers.

Additionally, an embodiment provides a computing device. The computing device includes a master device and a slave device coupled to the master device. The master device operates at N bits per clock cycle and the slave device operates at M bits per clock cycle. A converter coupled to the master device and the slave device. The converter, during a write operation, receives N bits from the master device at every clock cycle and store bits received from the master device. The converter provide M bits to the slave device when a number of bits stored in the converter is equal or more than M.

Other aspects and example embodiments are provided in the Drawings and the Detailed Description that follows.

BRIEF DESCRIPTION OF THE VIEWS OF DRAWINGS

FIG. 2 is a table that illustrates parameters of a circuit, for testing an integrated circuit (IC), as a function of scan clock, according to an embodiment;

Figure 4:
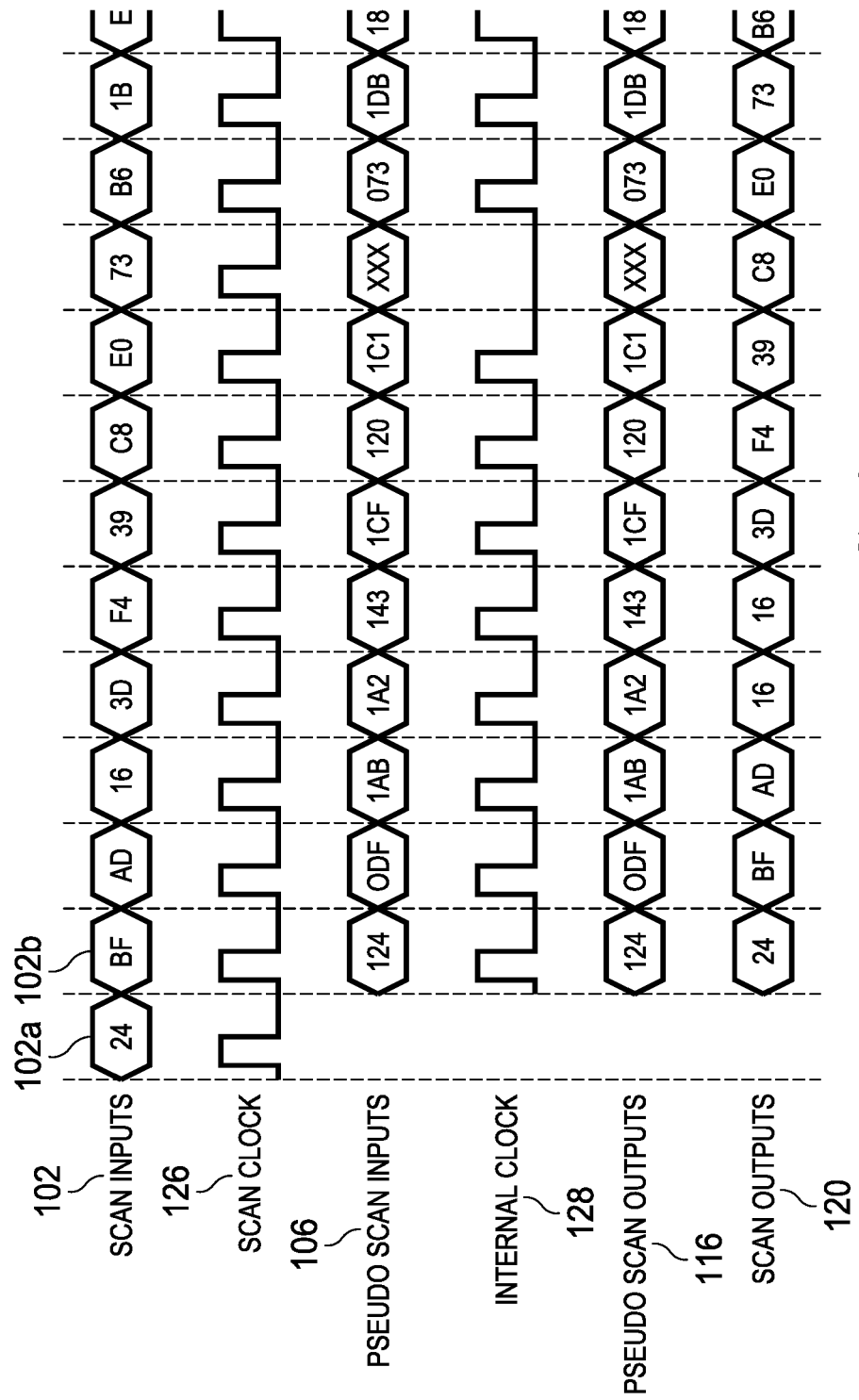
Figure 5:
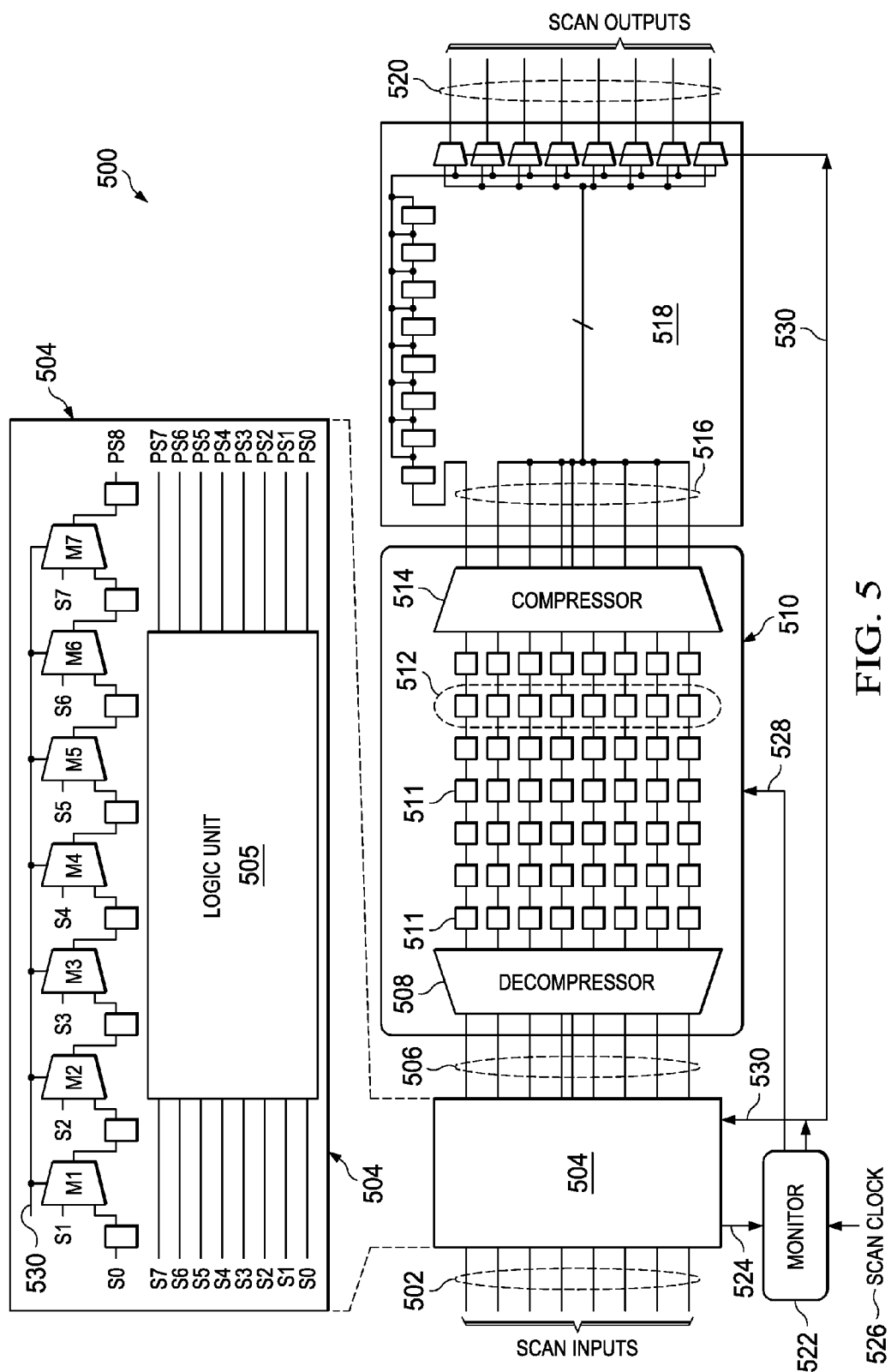
Figure 7:
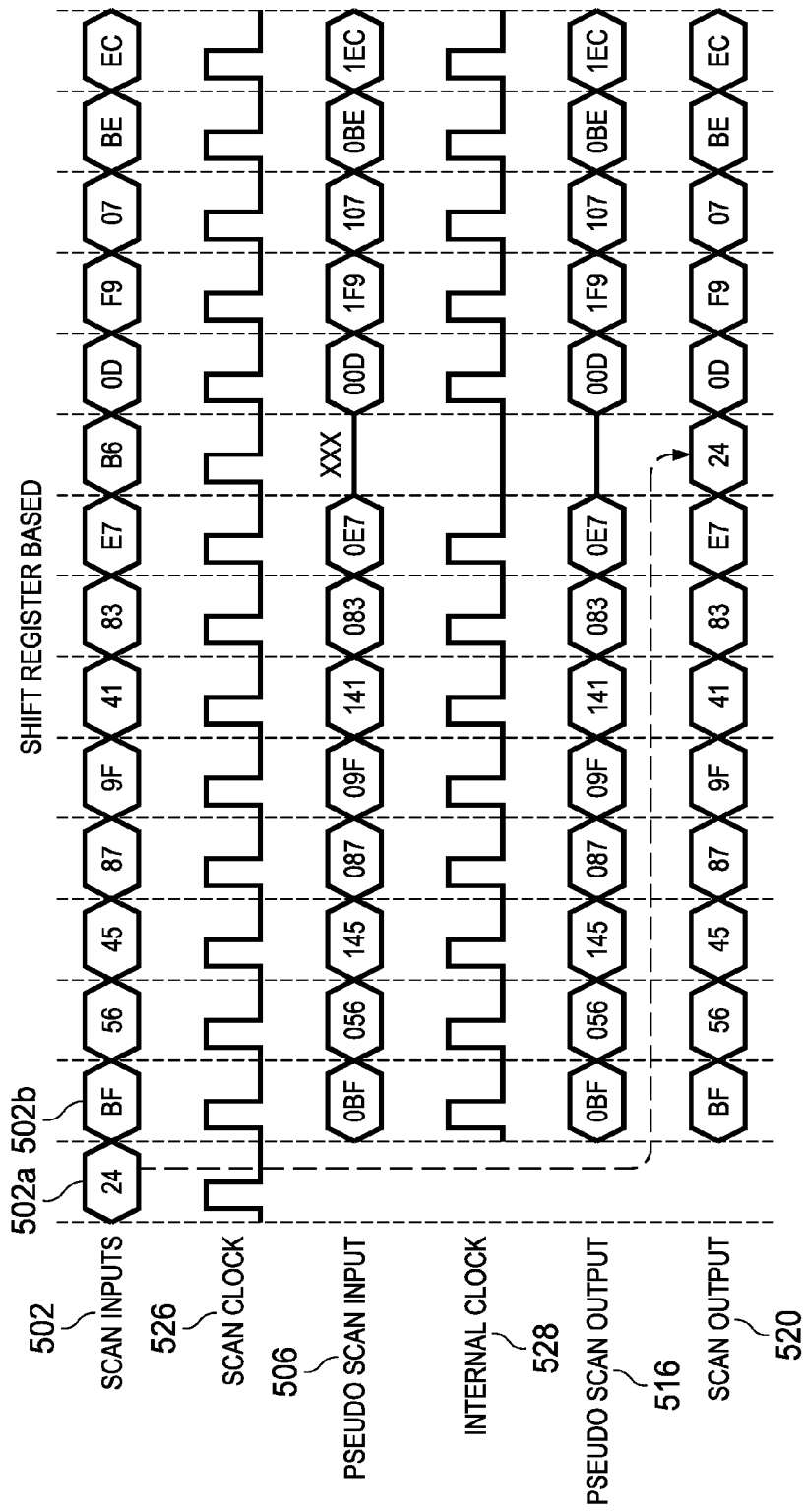

FIG. 3(a) and FIG. 3(b) illustrate fractional data packing in a circuit for testing an integrated circuit (IC), according to an embodiment;

FIG. 4 illustrates a timing diagram of a circuit for testing an integrated circuit (IC), according to an embodiment;

FIG. 5 illustrates a schematic of a circuit for testing an integrated circuit (IC), according to an embodiment;

FIG. 6(a) and FIG. 6(b) illustrate fractional data packing in a circuit for testing an integrated circuit (IC), according to an embodiment;

FIG. 7 illustrates a timing diagram of a circuit for testing an integrated circuit (IC), according to an embodiment; and FIG. 8 illustrates a computing device according to an embodiment.

DETAILED DESCRIPTION OF THE EMBODIMENTS

Figure 1:
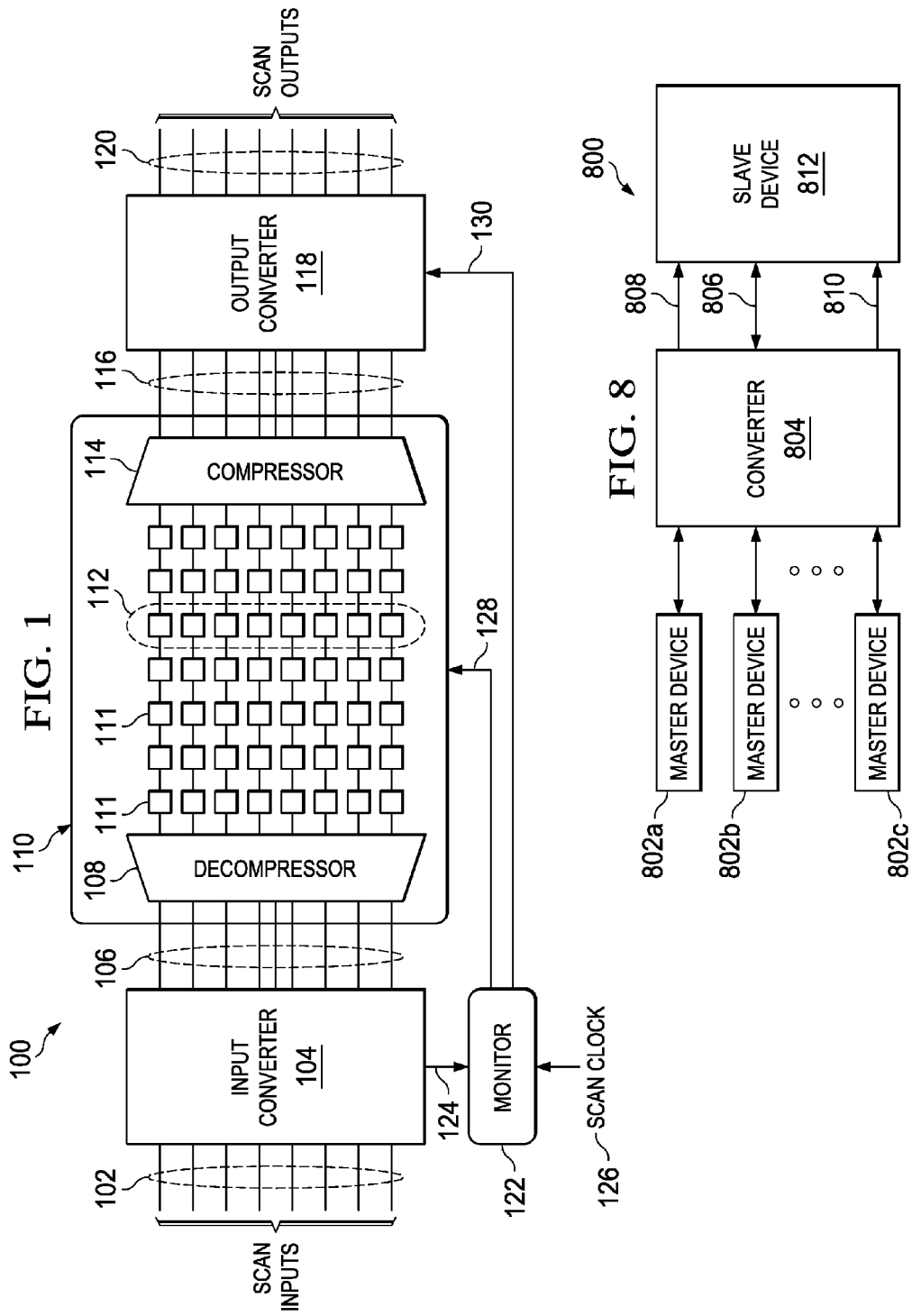
FIG. 1 illustrates a schematic of a circuit for testing an integrated circuit (IC)

FIG. 1 illustrates a schematic of a circuit 100 for testing an integrated circuit (IC), according to an embodiment. The circuit 100 includes an input converter 104. The input converter 104 receives N scan inputs 102 from a tester (not illustrated in FIG. 1), where N is an integer. Examples of some testers may include a very low cost tester (VLCT) or high-end testers. The input converter 104 generates M pseudo scan inputs 106, where M is an integer. In an embodiment, the input converter 104 is a FIFO (first-in first-out) buffer. A scan compression architecture 110 is coupled to the input converter 104. The scan compression architecture 110 receives M pseudo scan inputs 106 and generates P pseudo scan outputs 116 in response to the M pseudo scan inputs 106. The scan compression architecture 110 includes a decompressor 108, a plurality of scan chains 112 and a compressor 114. The decompressor 108 is coupled to the input converter 104 and receives M pseudo scan inputs 106. The decompressor 108 is coupled to the plurality of scan chains 112. Each scan chain of the plurality of scan chains 112 includes a plurality of scan cells for example scan cell 111. The compressor 114 is coupled to the plurality of scan chains 112. The compressor 114 generates P pseudo scan outputs 116, where P is an integer. An output converter 118 is coupled to the compressor 114. The output converter 118 receives the P pseudo scan outputs 116 and generates Q scan outputs 120, where Q is an integer. In an embodiment, the output converter 118 is a FIFO (first-in first-out) buffer. The circuit 100 includes a monitor 122. The monitor 122 receives a status signal 124 from the input converter 104 and also receives a scan clock 126. The monitor 122 generates an internal clock 128 and an enable signal 130. The internal clock 128 is provided to the scan compression architecture 110. The output converter 118 receives the enable signal 130 from the monitor 122. The circuit 100 may include one or more additional components known to those skilled in the relevant art and are not discussed here for simplicity of the description.

The operation of the circuit 100 illustrated in FIG. 1 is explained now. The input converter 104 receives the N scan inputs 102 and generates the M pseudo scan inputs 106. The scan compression architecture 110 receives the M pseudo scan inputs 106 and generates the P pseudo scan outputs 116. The decompressor 108 receives the M pseudo scan inputs 106 and generates a plurality of core scan inputs in response to the M pseudo scan inputs 106. The plurality of core scan inputs is provided to the plurality of scan chains 112. Each scan chain of the plurality of scan chains 112 includes the plurality of scan cells for example scan cell 111. Each scan cell 111 of the plurality of scan cells shifts a core scan input of the plurality of core scan inputs at a frequency of the internal clock 128. The plurality of scan chains 112 generates a plurality of core scan outputs in response to the plurality of core scan inputs received by the plurality of scan chains 112. The compressor 114 receives the plurality of core scan outputs and generates P pseudo scan outputs 116 in response to the plurality of core scan outputs. The output converter 118 receives the P pseudo scan outputs 116 and generates Q scan outputs 120. The input converter 104 receives the N scan inputs 102 at a first frequency and generates the M pseudo scan inputs 106 at a second frequency and the output converter 118 receives the P pseudo scan outputs 116 at the second frequency and generates the Q scan outputs 120 at the first frequency. The ratio of the first frequency and the second frequency is equal to a ratio of M and N and to a ratio of P and Q. The monitor 122 receives the scan clock 126 and generates the internal clock 128. The frequency of the internal clock 128 is equal to the second frequency. The plurality of scan chains 112 is driven by the internal clock 128.

The input converter 104 receives N scan inputs 102 at every scan clock 126. The input converter 104 is configured to store the N scan inputs 102 and generates M pseudo scan inputs 106 when a number of scan inputs 102 stored in the input converter 104, at the beginning of a scan clock, is equal or more than M. In an embodiment, when N is equal to 8 and M is equal to 9, the input converter 104 receives 8 scan inputs 102 in a first scan clock. Since 8 is less than M, the input converter 104 does not generate M pseudo scan inputs 106 in the first scan clock.

These 8 scan inputs 102 are stored in the input converter 104. In the next scan clock i.e. the second scan clock, the input converter 104 receives another 8 scan inputs 102 and the total number of scan inputs 102 stored in the input converter 104, at the beginning of the second scan clock, is more than M. Thus, the input converter 104 generates 9 pseudo scan inputs 106 in the second scan clock and the number of remaining scan inputs stored in the input converter 104 is 7 (16−9=7). This process is referred as fractional data packing and is further explained later in the description with the help of FIG. 2 and FIG. 3. The monitor 122 receives the status signal 124 from the input converter 104. The status signal 124 updates the monitor 122 on the number of scan inputs stored in the input converter 104 at a beginning of every scan clock. For example, in the embodiment explained above, the status signal 124 would update the monitor 122 that 8 scan inputs are stored in the input converter 104 at the beginning of the first scan clock and 16 scan inputs are stored in the input converter 104 at the beginning of the second scan clock. The monitor 122 is configured to discontinue the internal clock 128 to the scan compression architecture 110 when the number of scan inputs stored in the input converter 104, at the beginning of a scan clock, is less than M. Thus, the shifting of core scan inputs in the plurality of scan cells is stopped when the number of scan inputs stored in the input converter 104 at the beginning of a scan clock, is less than M.

The output converter 118 generates Q scan outputs at every scan clock 126 other than the first scan clock. In an embodiment, when N is equal to 8 and M is equal to 9, the input converter 104 receives 8 scan inputs 102 in a first scan clock. Since 8 is less than M, the input converter 104 does not generate M pseudo scan inputs 106 in the first scan clock. These 8 scan inputs 102 are stored in the input converter 104 and the output converter 118 does not receive any input in the first scan clock. In the next scan clock i.e. the second scan clock, the input converter 104 receives another 8 scan inputs 102 and the total number of scan inputs stored in the input converter 104 is more than M. Thus, the input converter 104 generates 9 pseudo scan inputs 106 in the second scan clock. When P is equal to 9 and Q is equal to 8, the scan compression architecture 110 receives 9 pseudo scan inputs 106 and generates 9 pseudo scan outputs 116. The output converter 118 receives the 9 pseudo scan outputs 116 and generates 8 scan outputs 120. 1 pseudo scan output is stored in the output converter 118. In the third scan clock, the output converter 118 receives the 9 pseudo scan outputs 116 and generates 8 scan outputs 120. A total of 2 pseudo scan outputs are then stored in the output converter 118.

Similarly, after 9 scan clocks, a total of 8 pseudo scan outputs are stored in the output converter 118. In the $10^{th}$ scan clock, the output converter 118 generates 8 scan outputs 120 and the number of pseudo scan outputs stored in the output converter 118 is zero. The output converter 118 receives the enable signal 130 from the monitor 122. The enable signal 130 is configured to disable the storage of pseudo scan outputs in the output converter 118 when a number of pseudo scan outputs stored in the output converter 118, at the beginning of a scan clock, is less than Q. In one embodiment, the enable signal 130 is configured to disable the storage of pseudo scan outputs in the output converter 118 when no pseudo scan outputs are received by the output converter 118. In one embodiment, a storage depth of the input converter 104 is K bits, where K is an integer and K is greater than or equal to 2N and a storage depth of the output converter 118 is L bits, wherein L is an integer and L is greater than or equal to 2P.

The circuit 100 is adaptable to all devices irrespective of the number of pins. Thus, when A pins provide optimal test timing and a device or an integrated circuit to be tested is of B pins, the circuit 100 does not require A to be an integer multiple of B. Also, the problem of don't care inputs does not arise in circuit 100. The test timing required in circuit 100 is drastically reduced as compared to the existing art.

FIG. 2 is a table 200 that illustrates parameters of a circuit, for testing an integrated circuit (IC), as a function of scan clock, according to an embodiment. The table 200 is explained with the help of circuit 100 illustrated in FIG. 1, when N is 8, M is 9, P is 9 and Q is 8. Row 1 illustrates the scan clock 126 received by the circuit 100. For the purpose of illustration and not for the purpose of limitation, only 12 scan clocks are represented in table 200. Row 2 illustrates a number of scan inputs (similar to scan inputs 102) stored in the input converter 104 at the end of a scan clock. The input converter 104 is configured to store the N scan inputs 102 and generates M pseudo scan inputs 106 when a number of scan inputs stored in the input converter 104, at the beginning of a scan clock, is equal or more than M. When N is equal to 8 and M is equal to 9, the input converter 104 receives 8 scan inputs 102 at scan clock 1. Since 8 is less than M, the input converter 104 does not generate M pseudo scan inputs 106 in the first scan clock (scan clock 1). These 8 scan inputs 102 are stored in the input converter 104. In the next scan clock i.e. scan clock 2, the input converter 104 receives another 8 scan inputs 102 and the total number of scan inputs stored in the input converter 104 at the beginning of scan clock 2 is more than M.

Thus, the input converter 104 generates 9 pseudo scan inputs 106 at scan clock 2 and the number of remaining scan inputs stored in the input converter 104 at the end of scan clock 2 is 7 (16−9=7) as illustrated in Row 2 (below scan clock 2). This process is referred as fractional data packing as a fraction of scan inputs received at the scan clock 2 is sent as part of pseudo scan inputs. Similarly, at scan clock 3, next set of 8 scan inputs 102 are received at the input converter 104. The total number of scan inputs stored in the input converter 104 at the beginning of scan clock 3 is (7+8=15) which is more than M. Thus, the input converter 104 generates 9 pseudo scan inputs 106 in the third scan clock and the number of remaining scan inputs stored in the input converter 104 at the end of third scan clock is 6 (15−9=6) as illustrated in Row 2 (below scan clock 3). In a similar fashion, at scan clock 9, a set of 8 scan inputs 102 are received at the input converter 104. The total number of scan inputs stored in the input converter 104 is (1+8=9) which is equal to M. Thus, the input converter 104 generates 9 pseudo scan inputs 106 in the ninth scan clock (scan clock 9) and the number of remaining scan inputs stored in the input converter 104 at the end of ninth scan clock is 0 (9−9=0) as illustrated in Row 2 (below scan clock 9). At scan clock 10, the input converter 104 receives another set of 8 scan inputs 102 which gets stored in the input converter 104.

At scan clock 2, the internal clock 128 to the scan compression architecture 110 is enabled as 9 pseudo scan inputs 106 are received from the input converter 104, as illustrated in Row 3 (below scan clock 2). The monitor 122 continues to provide internal clock 128 to the scan compression architecture 110 as long as the number of scan inputs stored in the input converter 104 at the beginning of a scan clock is equal or more than M. The monitor 122 discontinues the internal clock 128 to the scan compression architecture 110 when the number of scan inputs stored in the input converter 104 is less than M as illustrated in the table 200 at scan clock 10 in Row 3. At scan clock 10, the input converter 104 receives another set of 8 scan inputs 102 which gets stored in the input converter 104. Since 8 is less than M (M=9), the input converter 104 does not generate M pseudo scan inputs 106 in the tenth scan clock (scan clock 10). Hence, the monitor 122 discontinues the internal clock 128 to the scan compression architecture 110 at scan clock 10 (illustrated as 0 in Row 3 below scan clock 10).

As the internal clock 128 is provided to the scan compression architecture 110 at scan clock 2, the scan compression architecture 110 generates 9 pseudo scan outputs 116 in response to the 9 pseudo scan inputs 106 received from the input converter 104. The output converter 118 generates Q scan outputs 120 when the number of pseudo scan outputs stored in the output converter 118 at the beginning of a scan clock is more than or equal to Q. At the beginning of scan clock 2, the 9 pseudo scan outputs 116 are received and stored in the output converter 118. As Q is 8 and the number of pseudo scan outputs stored in the output converter 118 is 9, the output converter 118 generates 8 scan outputs 120 and the number of remaining pseudo scan outputs stored in the output converter 118 at the end of scan clock 2 is 1 (9−8=1) as illustrated in Row 4 (below scan clock 2). At scan clock 3, next set of 9 pseudo scan outputs 116 are received at the output converter 118. The total number of pseudo scan outputs stored in the output converter 118 is (1+9=10) which is more than Q. Thus, the output converter 118 generates 8 scan outputs 120 in the third scan clock and the number of remaining pseudo scan outputs stored in the output converter 118 at the end of third scan clock is 2 (10−8=2) as illustrated in Row 4 (below scan clock 3). Similarly, at scan clock 9, a set of 9 pseudo scan outputs 116 are received at the output converter 118. The total number of pseudo scan outputs stored in the output converter 118 is (7+9=16) which is more than Q. Thus, the output converter 118 generates 8 scan outputs 120 in the ninth scan clock (scan clock 9) and the number of remaining pseudo scan outputs stored in the output converter 118 at the end of ninth scan clock is 8 (16−8=8) as illustrated in Row 4 (below scan clock 9). At scan clock 10, the input converter 104 does not generate pseudo scan inputs 106 and also the internal clock 128 to the scan compression architecture 110 is also disabled. However, the output converter 118 has 8 pseudo scan outputs stored which is equal to Q and hence generates 8 scan outputs 120 at the scan clock 10 and the number of remaining pseudo scan outputs stored in the output converter 118 at the end of scan clock 10 is 0 (8−8=0) as illustrated in Row 4 (below scan clock 10). Row 5 illustrates the enable signal 130 which is received by the output converter 118 from the monitor 122. The enable signal 130 is configured to disable the storage of pseudo scan outputs in the output converter 118 when the number of pseudo scan outputs 116 stored in the output converter 118 at the beginning of a scan clock is less than Q. The enable signal 130 is similar to the internal clock 128. When the monitor 122 discontinues the internal clock 128, the enable signal 130 to the output converter 118 is also disabled.

FIG. 3(a) and FIG. 3(b) illustrate fractional data packing in a circuit for testing an integrated circuit (IC), according to an embodiment. For illustrative purpose and not for the purpose of limitation, the fractional data packing is illustrated with the help of circuit 100 in FIG. 1, when N is equal to 8 and M is equal to 9. FIG. 3(a) is a table that illustrates the scan inputs received at the input converter 104 for scan clocks 308 (scan clock 1 to scan clock 11). The 8 scan inputs are shown in column 302 as S0 to S7. A column 304 illustrates the values of scan inputs received at scan clock 1. Similarly, column 306 represents the values of scan inputs received at scan clock 2. FIG. 3(b) is a table that illustrates the pseudo scan inputs generated by the input converter 104 in response to the received scan inputs illustrated in FIG. 3(a) for scan clocks 308 (scan clock 1 to scan clock 11). A column 312 represents the 9 pseudo scan inputs as PS0 to PS8. As seen in column 314, no pseudo scan inputs are generated at scan clock 1. As the input converter 104 receives 8 scan inputs at scan clock 1 and 8 is less than M (=9), the input converter 104 does not generate pseudo scan inputs in the scan clock 1. At scan clock 2, the input converter 104 generates 9 pseudo scan inputs illustrated in column 316. The 9 pseudo scan inputs generated at scan clock 2 includes the 8 scan inputs received at the input converter 104 at scan clock 1 and 1 scan input received at the input converter 104 at scan clock 2. Similarly, the 9 pseudo scan inputs generated at scan clock 3 (illustrated in column 318) includes 7 scan inputs received at the input converter 104 at scan clock 2 and 2 scan inputs received at scan clock 3. This process is referred as fractional data packing as a fraction of scan inputs received at the scan clock 2 is sent as part of pseudo scan inputs at the scan clock 2. For simplicity of description, the values of scan inputs and pseudo scan inputs are same in FIG. 3(a) and FIG. 3(b) respectively. However, in an embodiment, the input converter 104 processes the scan inputs and generates different values of pseudo scan inputs. The 9 pseudo scan inputs generated at scan clock 8 (illustrated in column 320) includes 2 scan inputs received at the input converter 104 at scan clock 7 and 7 scan inputs received at scan clock 8. Also, the 9 pseudo scan inputs generated at scan clock 9 (illustrated in column 322) includes 1 scan input received at the input converter 104 at scan clock 8 and 8 scan inputs received at scan clock 9. At scan clock 10, the input converter 104 receives another set of 8 scan inputs which gets stored in the input converter 104 (column 309). However, 8 scan inputs at scan clock 10 is less than M (=9), thus the input converter 104 does not generate pseudo scan inputs in the scan clock 10 (illustrated in column 324). The values of scan inputs and pseudo scan inputs illustrated in FIG. 3(a) and FIG. 3(b) is for illustrative purpose and is understood not to limit the scope of the present disclosure.

FIG. 4 illustrates a timing diagram of a circuit for testing an integrated circuit (IC), according to an embodiment. For illustrative purpose and not for the purpose of limitation, the timing diagram is illustrated with the help of the circuit 100 in FIG. 1, when N is equal to 8, M is equal to 9, P is equal to 9 and Q is equal to 8. The timing diagram illustrates scan inputs 102 received at every scan clock 126. Each block represented in FIG. 4 such as block 102a and 102b represents a plurality of scan inputs. Each block such as block 102a and 102b is a set of bits that represents a plurality of scan inputs. When N is equal to 8, each block represents 8 scan inputs. Thus, 8 scan inputs are received at every scan clock 126. At the first scan clock, no pseudo scan inputs 106 are generated as the number of scan inputs stored in the input converter 104 is less than 9. At the second scan clock, the number of scan inputs stored in the input converter 104 is more than 9 and hence 9 pseudo scan inputs 106 are generated at second scan clock. The internal clock 128 is enabled when 9 pseudo scan inputs 106 are received from the input converter 104. The monitor 122 continues to provide internal clock 128 to the scan compression architecture 110 as long as the number of scan inputs stored in the input converter 104 at the beginning of a scan clock is more than M. The monitor 122 discontinues the internal clock 128 to the scan compression architecture 110 when the number of scan inputs stored in the input converter 104 is less than M as illustrated in the FIG. 4 at scan clock 10 represented as XXX. At scan clock 10, the input converter 104 receives another set of 8 scan inputs which gets stored in the input converter 104. Since 8 is less than M (M=9), the input converter 104 does not generate M pseudo scan inputs 106 in the tenth scan clock (scan clock 10). Hence, the monitor 122 discontinues the internal clock 128 to the scan compression architecture 110 at scan clock 10. The values of scan inputs 102 and pseudo scan inputs 106 represented in FIG. 4 are according to an example embodiment and are understood not to limit the scope of the present disclosure.

As the internal clock 128 is provided to the scan compression architecture 110 at scan clock 2, the scan compression architecture 110 generates 9 pseudo scan outputs 116 in response to the 9 pseudo scan inputs 106 received from the input converter 104. The output converter 118 generates Q scan outputs 120 when the number of pseudo scan outputs stored in the output converter 118 at the beginning of a scan clock is more than or equal to Q. At the beginning of scan clock 2, the 9 pseudo scan outputs 116 are received and stored in the output converter 118. As Q is 8 and the number of pseudo scan outputs stored in the output converter 118 is 9, the output converter 118 generates 8 scan outputs 120. As described above, no pseudo scan inputs 106 are generated at scan clock 10, therefore no pseudo scan outputs 116 are generated at scan clock 10 represented as XXX. However, the output converter 118 continues to generate scan outputs 120 at all scan clocks. The output converter 118 has 8 pseudo scan outputs stored at the scan clock 10 which is equal to Q and hence generates 8 scan outputs 120. The values of scan inputs 102, pseudo scan inputs 106, pseudo scan outputs 116 and scan outputs 120 represented in FIG. 4 are according to an example embodiment and are understood that in an embodiment, the scan outputs 120 will be different from the scan inputs 102.

FIG. 5 illustrates a schematic of a circuit 500 for testing an integrated circuit (IC), according to an embodiment. The circuit 500 includes an input converter 504. The input converter 504 receives N scan inputs 502 from a tester (not illustrated in FIG. 5), where N is an integer. In one of the embodiments, the input converter 504 receives a plurality of scan inputs from the tester. For the purpose of illustration, N is 8 and the scan inputs 502 are shown as S0 to S7. Examples of some testers may include a very low cost tester (VLCT) or high-end testers. The input converter 504 generates M pseudo scan inputs 506, where M is an integer. For the purpose of illustration, M is 9 and the pseudo scan inputs 506 are shown as PS0 to PS8. The input converter 504 further includes a logic unit 505 which is configured to process a set of scan inputs of the N scan inputs 502 and generate a set of pseudo scan inputs 506 of the M pseudo scan inputs 506. In one embodiment, the logic unit 505 is configured to process scan inputs S0 to S7 and generates pseudo scan inputs PS0 to PS7. The input converter 504 includes a plurality of multiplexers and a plurality of flip-flops coupled together and configured to generate pseudo scan input PS8. In one embodiment, the input converter 504 includes 7 multiplexers (M1-M7) and each multiplexer of the 7 multiplexer receives a scan input of the scan inputs S1-S7 as a first input. The input converter 504 includes eight flip-flops arranged serially and each flip-flop is coupled to a second input of a multiplexer. Each multiplexer receives an enable signal 530 from a monitor 522. A first flip-flop of the eight flip-flops receives scan input S0 and a last flip-flop of the eight flip-flops generates pseudo scan input PS8. It should be noted, however, that the scope of the present disclosure is not limited to any or all of the embodiments disclosed herein. Indeed, one or more of the devices, features, operations, processes, characteristics, or other qualities of a disclosed embodiment may be removed, replaced, supplemented, or changed. In another embodiment, a combination of sequential devices is used to generate one or more pseudo scan inputs.

A scan compression architecture 510 is coupled to the input converter 504. The scan compression architecture 510 receives M pseudo scan inputs 506 and generates P pseudo scan outputs 516 in response to the M pseudo scan inputs 506. In an embodiment, the scan compression architecture 510 receives 9 pseudo scan inputs 506 and generates 9 pseudo scan outputs 516 in response to the 9 pseudo scan inputs 506. The scan compression architecture 510 includes a decompressor 508, a plurality of scan chains 512 and a compressor 514. The decompressor 508 is coupled to the input converter 504 and receives M pseudo scan inputs 506. The decompressor 508 is coupled to the plurality of scan chains 512. Each scan chain of the plurality of scan chains 512 includes a plurality of scan cells for example scan cells 511. The compressor 514 is coupled to the plurality of scan chains 512. The compressor 514 generates P pseudo scan outputs 516, where P is an integer. An output converter 518 is coupled to the compressor 514. The output converter 518 receives the P pseudo scan outputs 516 and generates Q scan outputs 520, where Q is an integer. In the illustrated embodiment, P is 9 and Q is 8. Thus, the output converter 518 receives the 9 pseudo scan outputs 516 and generates 8 scan outputs 520. In one embodiment, the output converter 518 includes a plurality of multiplexers and a plurality of flip-flops coupled together and configured to generate Q scan outputs. In one embodiment, the output converter 518 includes 8 multiplexers and each multiplexer of the 8 multiplexers receives a pseudo scan output of the 9 pseudo scan outputs as a first input. The output converter 518 includes eight flip-flops arranged serially and an output of each flip-flop is coupled to a second input of a multiplexer. Each multiplexer receives the enable signal 530 from the monitor 522. A first flip-flop of the eight flip-flops receives one pseudo scan output. It should be noted, however, that the scope of the present disclosure is not limited to any or all of the embodiments disclosed herein. Indeed, one or more of the devices, features, operations, processes, characteristics, or other qualities of a disclosed embodiment may be removed, replaced, supplemented, or changed. In another embodiment, a combination of sequential devices is used in the output converter 518 to generate one or more scan outputs. In one embodiment, a storage depth of the input converter 504 is K bits, where K is an integer and K is greater than or equal to 2N and a storage depth of the output converter 518 is L bits, wherein L is an integer and L is greater than or equal to 2P.

The circuit 500 includes the monitor 522. The monitor 522 receives a status signal 524 from the input converter 504 and also receives a scan clock 526. The monitor 522 generates an internal clock 528 and an enable signal 530. The internal clock 528 is provided to the scan compression architecture 510. The output converter 518 receives the enable signal 530 from the monitor 522. The circuit 500 may include one or more additional components known to those skilled in the relevant art and are not discussed here for simplicity of the description.

The operation of the circuit 500 illustrated in FIG. 5 is explained now. For the ease of understanding, the operation of the FIG. 5 is explained when N is equal to 8, M is equal to 9, P is equal to 9 and Q is equal to 8. It should be noted, however, that the scope of the present technology is not limited to any or all of the embodiments disclosed herein. The input converter 504 receives the 8 scan inputs 502 and generates the 9 pseudo scan inputs 506. The scan compression architecture 510 receives the 9 pseudo scan inputs 506 and generates the 9 pseudo scan outputs 516. The decompressor 508 receives the 9 pseudo scan inputs 506 and generates a plurality of core scan inputs in response to the 9 pseudo scan inputs 506. The plurality of core scan inputs is provided to the plurality of scan chains 512. Each scan cell 511 of the plurality of scan cells shifts a core scan input of the plurality of core scan inputs at a frequency of the internal clock 528. The plurality of scan chains 512 generates a plurality of core scan outputs in response to the plurality of core scan inputs received by the plurality of scan chains 512. The compressor 514 receives the plurality of core scan outputs and generates 9 pseudo scan outputs 516 in response to the plurality of core scan outputs. The output converter 518 receives the 9 pseudo scan outputs 516 and generates 8 scan outputs 520. The input converter 504 receives the 8 scan inputs 502 at a first frequency and generates the 9 pseudo scan inputs 506 at a second frequency and the output converter 518 receives the 9 pseudo scan outputs 516 at the second frequency and generates the 8 scan outputs 520 at the first frequency. The ratio of the first frequency and the second frequency is equal to a ratio of M and N and to a ratio of P and Q. The monitor 522 receives the scan clock 526 and generates the internal clock 528. A frequency of the internal clock 528 is equal to the second frequency. The plurality of scan chains 512 is driven by the internal clock 528 at the second frequency.

The input converter 504 receives N scan inputs at every scan clock 526. The input converter 504 is configured to store the 8 scan inputs 502 and generates 9 pseudo scan inputs 506 when a number of scan inputs stored in the input converter 504, at the beginning of a scan clock, is equal or more than 9. The input converter 504 receives 8 scan inputs 502 in a first scan clock.

Since 8 is less than M, the input converter 504 does not generate M pseudo scan inputs 506 in the first scan clock. The first flip-flop of the eight flip-flops receives scan input S0 and the rest of the scan inputs are provided to the first input of each multiplexer of the seven multiplexers for example multiplexer M1 receives scan input S1 and multiplexer M7 receives scan input S7. In the next scan clock i.e. the second scan clock, the input converter 504 receives another 8 scan inputs 502. These scan inputs are provided as S0-S7 to the input converter 504. The logic unit 505 processes these scan inputs S0-S7 and generates eight pseudo scan inputs PS0-PS7. In one embodiment, the logic unit 505 is a buffer and therefore the values of pseudo scan inputs are same as scan inputs. The monitor 522 provides an enable signal to the plurality of multiplexers and a scan input (S7) received in the first scan clock is shifted through the plurality of flip-flops to generate the pseudo scan input PS8. Thus, the input converter 504 generates 9 pseudo scan inputs in the second scan clock. Similarly, at a third scan clock, the input converter 504 receives another 8 scan inputs. These scan inputs are provided as S0-S7 to the input converter 504. The logic unit 505 processes these scan inputs (S0-S7) and generates eight pseudo scan inputs PS0-PS7. The monitor 522 provides an enable signal to the plurality of multiplexers and a scan input (S6) received in the first scan clock is shifted through the plurality of flip-flops to generate the pseudo scan input PS8. Thus, the input converter 504 generates 9 pseudo scan inputs 506 in the third scan clock. This process is referred as fractional data packing and is further explained later in the description with the help of FIG. 6(a) and FIG. 6(b). The monitor 522 receives the status signal 524 from the input converter 504. The status signal 524 updates the monitor 522 on the number of scan inputs stored in the input converter 504 at the inputs of the multiplexers at the beginning of every scan clock. For example, in the embodiment explained above, the status signal 524 would update the monitor 522 that 8 scan inputs are stored in the input converter 504 at the beginning of first scan clock and 16 scan inputs are stored in the input converter 504 at the beginning of the second scan clock. The monitor 522 is configured to discontinue the internal clock 528 to the scan compression architecture 510 when the number of scan inputs stored in the input converter 504 at the beginning of a scan clock, is less than M. Thus, the shifting of core scan inputs in the plurality of scan cells is stopped when the number of scan inputs stored in the input converter 504 at the beginning of a scan clock, is less than M. At the ninth scan clock, the eight scan inputs and a scan input (S0) stored in the first scan clock, together form the 9 pseudo scan inputs that are provided to the scan compression architecture 510. At the tenth scan clock, a new set of 8 scan inputs 502 is received at the input converter 504. Since 8 is less than M, the input converter 504 does not generate M pseudo scan inputs 506 in the tenth scan clock. The first flip-flop of the eight flip-flops receives scan input S0 and the rest of the scan inputs are provided to the first input of each multiplexer of the seven multiplexers for example multiplexer M1 receives scan input S1 and multiplexer M7 receives scan input S7.

The output converter 518 generates 8 scan outputs 520 at every scan clock 526 other than the first scan clock. The input converter 504 receives 8 scan inputs 502 in the first scan clock. Since 8 is less than M, the input converter 504 does not generate M pseudo scan inputs 506 in the first scan clock. These 8 scan inputs are stored in the input converter 504 and the output converter 518 does not receive any input in the first scan clock. In the next scan clock i.e. the second scan clock, the input converter 504 receives another 8 scan inputs 502. The input converter 504 generates 9 pseudo scan inputs 506 in the second scan clock. The scan compression architecture 510 receives 9 pseudo scan inputs 506 and generates 9 pseudo scan outputs 516. The output converter 518 receives the 9 pseudo scan outputs 516. One pseudo scan output of the 9 pseudo scan output is provided to a flip-flop of the eight flip-flops arranged serially. This pseudo scan output is stored in first flip-flop in the eight flip-flops arranged in a serial manner. The other eight pseudo scan outputs of the 9 pseudo scan outputs 516 are provided to the eight multiplexers. The monitor 522 provides the enable signal 530 to the eight multiplexers and the multiplexers generate the eight scan outputs 520. In the third clock cycle, when the 9 pseudo scan outputs 516 are received at the output converter 518, one pseudo scan output of the 9 pseudo scan output is provided to a flip-flop of the eight flip-flops arranged serially. The previously stored pseudo scan output is moved to the next flip-flop i.e. second flip-flop on receiving the scan clock. The other eight pseudo scan outputs of the 9 pseudo scan outputs are provided to the eight multiplexers. The monitor 522 provides the enable signal 530 to the eight multiplexers and the multiplexers generate the eight scan outputs 520. Thus, with each scan clock, a new pseudo scan output is stored in the flip-flop chain and the previously stored pseudo scan outputs in the flip-flops are shifted. Therefore, after 9 scan clocks, the eight flip-flops would get occupied by the pseudo scan outputs. Since at the tenth scan clock, the pseudo scan inputs 506 are not generated at the input converter 504, the data in the eight flip-flops is made available to the eight multiplexers and the multiplexers generate the eight scan outputs 520.

FIG. 6(a) and FIG. 6(b) illustrate fractional data packing in a circuit for testing an integrated circuit (IC), according to an embodiment. For illustrative purpose and not for the purpose of limitation, the fractional data packing is illustrated with the help of circuit 500 in FIG. 5, when N is equal to 8 and M is equal to 9. FIG. 6(a) is a table that illustrates the scan inputs received at the input converter 504 for scan clocks 608 (scan clock 1 to scan clock 18). The 8 scan inputs are shown in column 602 as S0 to S7. A column 604 illustrates the values of scan inputs received at scan clock 1. Similarly, column 606 represents the values of scan inputs received at scan clock 2. FIG. 6(b) is a table that illustrates the pseudo scan inputs generated by the input converter 504 in response to the received scan inputs illustrated in FIG. 6(a) for scan clocks 608 (scan clock 1 to scan clock 18). A column 612 represents the 9 pseudo scan inputs as PS0 to PS8. As seen in column 614, no pseudo scan inputs are generated at scan clock 1. As the input converter 504 receives 8 scan inputs at scan clock 1 and 8 is less than M (=9), the input converter 504 does not generate pseudo scan inputs in the scan clock 1. These scan inputs are stored in the flip-flop and multiplexer arrangement discussed in FIG. 5 and each of these scan input is shifted out as a pseudo scan input with each scan clock. At scan clock 2, the input converter 504 generates 9 pseudo scan inputs illustrated in column 616. The 9 pseudo scan inputs generated at scan clock 2 includes the 8 scan inputs received at the input converter 504 at scan clock 2 and 1 scan input received at the input converter 504 at scan clock 1. Similarly, the 9 pseudo scan inputs generated at scan clock 3 (illustrated in column 618) includes 8 scan inputs received at the input converter 504 at scan clock 2 and 1 scan input received at scan clock 1. The pseudo scan input PS8 over a span of 9 scan clocks represents the scan inputs received at the input converter 504 at scan clock 1 (illustrated as 615). This process is referred as fractional data packing as a fraction of scan inputs received at the scan clock 1 is sent as part of pseudo scan inputs. For simplicity of description, the values of scan inputs and pseudo scan inputs are same in FIG. 6(a) and FIG. 6(b) respectively. However, in an embodiment, the input converter 504 processes the scan inputs and generates different values of pseudo scan inputs. The 9 pseudo scan inputs generated at scan clock 8 (illustrated in column 620) includes 8 scan inputs received at the input converter 504 at scan clock 7 and 1 scan input received at scan clock 1. Also, the 9 pseudo scan inputs generated at scan clock 9 (illustrated in column 622) includes 8 scan inputs received at the input converter 504 at scan clock 8 and 1 scan input received at scan clock 1. At scan clock 10, the input converter 504 receives another set of 8 scan inputs which gets stored in the input converter 504 (column 609) in the flip-flops and multiplexer arrangement discussed in FIG. 5. However, 8 scan inputs at scan clock 10 is less than M (=9), thus the input converter 504 does not generate pseudo scan inputs in the scan clock 10 (illustrated in column 624).

FIG. 7 illustrates a timing diagram of a circuit for testing an integrated circuit (IC), according to an embodiment. For illustrative purpose and not for the purpose of limitation, the timing diagram is illustrated with the help of the circuit 500 in FIG. 5, when N is equal to 8, M is equal to 9, P is equal to 9 and Q is equal to 8. The timing diagram illustrates scan inputs 502 received at every scan clock 526. Each block represented in FIG. 4 such as block 502a and 502b represents a plurality of scan inputs. Each block such as block 502a and 502b is a set of bits that represents a plurality of scan inputs. When N is equal to 8, each block represents 8 scan inputs. Thus, 8 scan inputs are received at every scan clock 526. At the first scan clock, no pseudo scan inputs 506 are generated as the number of scan inputs stored in the input converter 504 is less than 9. These 8 scan inputs received at first scan clock gets stored in the input converter 504 in the flip-flops and multiplexer arrangement discussed in FIG. 5. At the second scan clock, the input converter 504 receives next set of 8 scan inputs and the number of scan inputs stored in the input converter 504 is 16 at the beginning of scan clock 2. Thus, 9 pseudo scan inputs are generated by the input converter 504. The internal clock 528 is enabled when 9 pseudo scan inputs are received from the input converter 504. The monitor 522 continues to provide internal clock 528 to the scan compression architecture 510 as long as the number of scan inputs stored in the input converter 504 at a beginning of a scan clock is equal or more than M. The monitor 522 discontinues the internal clock 528 to the scan compression architecture 510 when the number of scan inputs stored in the input converter 504 is less than M as illustrated in the FIG. 7 at scan clock 10 represented as XXX. At scan clock 10, the input converter 504 receives another set of 8 scan inputs which gets stored in the input converter 504. Since 8 is less than M (M=9), the input converter 504 does not generate M pseudo scan inputs in the tenth scan clock (scan clock 10). Hence, the monitor 522 discontinues the internal clock 528 to the scan compression architecture 510 at scan clock 10. The values of scan inputs and pseudo scan inputs represented in FIG. 4 are according to an example embodiment and are understood not to limit the scope of the present disclosure.

As the internal clock 528 is provided to the scan compression architecture 510 at scan clock 2, the scan compression architecture 510 generates 9 pseudo scan outputs 516 in response to the 9 pseudo scan inputs received from the input converter 504. The output converter 518 generates Q scan outputs when the number of pseudo scan outputs stored in the output converter 518 at the beginning of a scan clock is more than or equal to Q. At the beginning of scan clock 2, the 9 pseudo scan outputs 516 are received and stored in the output converter 518. As Q is 8 and the number of pseudo scan outputs stored in the output converter 518 is 9, the output converter 518 generates 8 scan outputs 520 and stores 1 pseudo scan output. As illustrated in the figure, the scan output 520 generated at the second scan clock is same as the scan input 502 received at the second scan clock. Similarly, at the beginning of scan clock 3, the 9 pseudo scan outputs 516 are received and stored in the output converter 518. The output converter 518 generates 8 scan outputs 520 and stores 1 pseudo scan output. As illustrated in the figure, the scan output 520 generated at the third scan clock is same as the scan input 502 received at the third scan clock. Thus at the end of third scan clock, the output converter stores 2 pseudo scan outputs. As discussed in FIG. 5, the pseudo scan outputs are stored in flip-flops arranged in a serial manner and with each scan clock, a new pseudo scan output is stored in the flip-flop chain and the previously stored pseudo scan outputs in the flip-flops are shifted in the flip-flop chain. As described above, no pseudo scan inputs are generated at scan clock 10, therefore no pseudo scan outputs 516 are generated at scan clock 10 represented as XXX. However, the output converter 518 continues to generate scan outputs 520 at scan clock 10. The pseudo scan outputs stored in the flip-flop chain is made available to the multiplexers and the multiplexers generate the eight scan outputs at the scan clock 10. As illustrated in the figure, the scan output 520 generated at the tenth scan clock is same as the scan input 502 received at the first scan clock. For ease of understanding, the values of scan inputs and scan outputs are shown same in FIG. 7. However, in an embodiment, the circuit 500 processes the scan inputs and generates different values of scan outputs.

FIG. 8 illustrates a computing device 800 according to an embodiment. The computing device 800 is, or is an integrated circuit incorporated into, a server farm, a computing device with hard-drive, a video recorder, a bluetooth device, a remote control, a keyboard, a global navigation satellite system, a mobile communication device, such as a mobile phone, a personal digital assistant, a personal computer, or any other type of electronic system.

In some embodiments, the computing device 800 can be one of, but not limited to, microcontroller, microprocessor or a system-on-chip (SoC). The computing device 800 includes plurality of master devices such as master device 802a, 802b and 802c. The master device can be, for example, a processing unit such as a CPU (Central Processing Unit), a CISC-type (Complex Instruction Set Computer) CPU, RISC-type CPU (Reduced Instruction Set Computer), or a digital signal processor (DSP). A converter 804 is coupled to at least one master device of the plurality of master devices. A slave device 812 is coupled to the converter 804. In one embodiment, a plurality of slave devices is coupled to the converter 804. The slave device 812 can be, for example, a memory, a pre-processor, a passive storage device or a logic unit. The converter 804 is bidirectionally coupled to the slave device 812 through the data path 806. The converter 804 also sends write enable signal 808 and read enable signal 810 to the slave device 812. The converter 804 is analogous to the input converter 104 illustrated in FIG. 1 or input converter 504 illustrated in FIG. 5, in operation. In an embodiment, the converter 804 is analogous to the output converter 118 or the output converter 518 in operation.

The operation of the computing device 800 illustrated in FIG. 8 is explained now. The plurality of master devices operate at N bits per clock cycle. For example, a master device 802a operates at 24 bits per clock cycle. Thus, data is read by the master device 802a at a rate of 24 bits/clock and the data is written by the master device 802a at a rate of 24 bits/clock. The slave device 812 operates at M bits per clock cycle. A write operation is defined as the master device 802a writing a data in the slave device 812 and a read operation is defined as the master device 802a reading the data from the slave device 812. During write operation, the converter 804 receives the data from the master device 802a at the rate of N bits per clock cycle. However, the slave device 812 operates at M bits per clock cycle. Therefore, the converter 804 temporarily stores the data received from the master device 802a and provides M bits to the slave device 812 through the data path 806 when a number of bits stored in the converter 804 is equal or more than M. The converter 804 also sends the write enable signal 808 to the slave device 812 at every clock cycle when the number of bits stored in the converter 804 is equal or more than M. The write enable signal 808 indicates to the slave device 812 that the data on the data path 806 is a valid data. For ease of understanding, the write operation is now explained with the help of an example in which the master device 802a operates at 24 bits per clock cycle and the slave device 812 operates at 32 bits per clock cycle. The converter 804 receives data from the master device 802a at a rate of 24 bits per clock cycle. Since, the slave device 812 operates at 32 bits per clock cycle, the data from the master device 802a cannot be written directly to the slave device 812. Therefore, the converter 804 temporarily stores the data received from the master device 802a and provides 32 bits to the slave device 812 through the data path 806 when a number of bits stored in the converter 804 is equal or more than 32. In a first clock cycle, the converter 804 would receive 24 bits of data and since it is less than 32, the converter 804 would store these 24 bits of data. In the second clock cycle, the converter 804 would receive another 24 bits of data. Thus, 48 bits of data is stored in the converter 804 at the beginning of the second clock cycle, which is more than M. Thus, at the second clock cycle, the converter 804 would provide 32 bits of data to the slave device 812. The total number of bits stored in the converter 804 at the end of second clock cycle is 16 (48−32=16). At the third clock cycle, the converter 804 would receive another 24 bits of data. Thus, 40 (16+24=40) bits of data is stored in the converter 804 at the beginning of the third clock cycle, which is more than M. Thus, at the third clock cycle, the converter 804 would provide 32 bits of data to the slave device 812. The total number of bits stored in the converter 804 at the end of third clock cycle is 8 (40−32=8). Also, the converter 804 sends write enable signal 808 to the slave device 812 at every clock cycle when the number of bits stored in the converter 804 at the beginning of a clock cycle, is equal or more than M.

This ensures that there is no wastage of memory. Also, the ratio of the operating speed of master device 802a and the slave device 812 (i.e. M and N) is not required to be an integer. The converter 804 provides fractional packing of data received from the master device 802a and transferring to the slave device 812. Similarly, during the read operation, the converter supports transfer of data from the slave device 812 to the master device 802a. The converter 804 sends the read enable signal 810 to the slave device 812 at every clock cycle when it is reading data from the slave device 812. When the master device 802a operates at 24 bits per clock cycle and the slave device 812 operates at 32 bits per clock cycle. During read operation, the converter 804 receives data from the slave device 812 at a rate of 32 bits per clock cycle. Since, the master device 802a operates at 24 bits per clock cycle, the data from the slave device 812 cannot be written directly to the master device 802a. In a first clock cycle, the converter 804 would receive 32 bits of data from the slave device 812 and these bits are stored in the converter 804. The converter 804 would provide 24 bits of data to the master device 802a and store the remaining 8 bits (32−24=8 bits) of data. In the second clock cycle, the converter 804 would receive another 32 bits of data from the slave device 812. Thus, 42 bits of data is stored in the converter 804 at the beginning of the second clock cycle, which is more than N. Thus, at the second clock cycle, the converter 804 would provide 24 bits of data to the master device 802a. The total number of bits stored in the converter 804 at the end of second clock cycle is 18 (42−24=18).

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed.

Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. A method of testing comprising:
receiving N scan inputs in an input converter at a first frequency;

generating M pseudo scan inputs by the input converter at a second frequency from N scan inputs, where M and N are integers;

generating P pseudo scan outputs by a scan compression architecture at the second frequency from M pseudo scan inputs; and generating Q scan outputs by an output converter at the first frequency from P pseudo scan outputs, wherein the input converter does not generate M pseudo scan inputs when N is less than M and, the output converter generates Q scan outputs when a number of pseudo scan outputs stored in the output converter is more than or equal to Q.

2. The method of claim 1 further comprising receiving the N scan inputs in the input converter at every scan clock and generating the M pseudo scan inputs at the second frequency.

3. The method of claim 1 further comprising generating P pseudo scan outputs at the second frequency from M pseudo scan inputs by a scan compression architecture, wherein the scan compression architecture is configured to be driven by an internal clock at the second frequency.

4. The method of claim 1 further comprising providing a status signal to a monitor, the monitor is configured to receive the scan clock and generate the internal clock, wherein the monitor is configured to discontinue the internal clock to the scan compression architecture when the number of scan inputs stored in the input converter, at the beginning of the scan clock, is less than M.

5. The method of claim 4 further comprising storing the N scan inputs in the input converter, and wherein the status signal is configured to update the monitor on a number of scan inputs stored in the input converter at a beginning of every scan clock.

* * * * *